(12) United States Patent
Bienvenu

(10) Patent No.: US 6,249,409 B1
(45) Date of Patent: Jun. 19, 2001

(54) PROTECTION OF A VERTICAL MOS TRANSISTOR ASSOCIATED WITH MEASUREMENT CELLS

(75) Inventor: Philippe Bienvenu, Allauch (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/211,772

(22) Filed: Dec. 15, 1998

(30) Foreign Application Priority Data

Dec. 31, 1997 (FR) .................................................. 97 16868

(51) Int. Cl.[7] .................................................. H02H 9/00
(52) U.S. Cl. .................................................. 361/54
(58) Field of Search .................. 361/54, 55, 56, 361/57, 18, 91.5, 91.6; 327/110, 139, 443; 323/276, 277

(56) References Cited

U.S. PATENT DOCUMENTS

| | | | |
|---|---|---|---|
| 4,931,844 | 6/1990 | Zommer | 357/23.4 |
| 5,410,171 | 4/1995 | Tsuzuki et al. | 257/337 |
| 5,420,532 | 5/1995 | Teggatz et al. | 327/365 |
| 5,917,254 * | 6/1999 | Lecce et al. | 327/110 |

OTHER PUBLICATIONS

French Search Report for French Patent Application No. 97/16868, filed Dec. 31, 1997.

* cited by examiner

*Primary Examiner*—Ronald W. Leja
(74) *Attorney, Agent, or Firm*—Wolf, Greenfield & Sacks, P.C.; James H. Morris; Theodore E. Galanthay

(57) ABSTRACT

The present invention relates to a device of protection of a monolithic component including a MOS-type vertical diffused power transistor formed of a great number of identical cells, and a measurement transistor formed of a smaller number of cells identical to those of the power transistor, the drains and the gates of all cells being common, an inductive load being connected to the source of the power transistor, a short-circuiting circuit connected between the source of the power transistor and the source of the measurement transistor, and a control circuit that turns on the short-circuiting circuit when the power transistor turns off.

30 Claims, 7 Drawing Sheets

PROTECTION OF A VERTICAL MOS TRANSISTOR ASSOCIATED WITH MEASUREMENT CELLS

BACKGROUND OF THE INVENTION

1. Field of the Invention

The present invention relates to vertical MOS power transistors and more specifically to the protection of a vertical MOS power transistor coupled with a vertical MOS current measurement transistor.

2. Discussion of the Related Art

A vertical MOS power transistor is generally formed of a large number of identical elementary cells in parallel. To measure the current in this transistor, it is usual to associate therewith a measurement transistor formed of a smaller number of the same elementary cells, submitted to the same biasing conditions. When the load of the power transistor is an inductive load, a negative voltage appears across the load upon turning-off of the power transistor. This voltage is likely to trigger the conduction of parasitic elements and to damage the power transistor.

FIG. 1 shows a circuit including a vertical MOS power transistor T1 formed of n elementary cells T11 to T1$n$, associated with a vertical MOS measurement transistor T2 including m elementary cells T21 to T2$m$, with m being much smaller than n. The drains D of the elementary cells of the power transistor and of the measurement transistor are connected together to a high potential Vcc. The gates G of the elementary cells of the power transistor and of the measurement transistor are connected together to a control terminal G. The sources S1 of the elementary cells of the power transistors are interconnected and connected by an inductive load L to the ground. The sources S2 of the elementary cells of the measurement transistor are interconnected and connected to a current source $I_{ref}$. The voltage difference between terminals S1 and S2 gives an indication of the fact that the current in the power transistor is greater than or smaller than a threshold equal to $(n/m)I_{ref}$.

It should be noted that in certain applications, current source Iref may be replaced with a resistor R, when the circuit is to measure a charge resistance instead of a charge current.

FIG. 2 schematically shows a vertical cross-sectional view of a portion of a silicon wafer 2 in which are made transistors T1 and T2. The drain of an elementary cell corresponds to substrate 21 of the wafer. Area 21 is connected via a heavily-doped N-type (N$^+$) area 20 to a metallization 22 connected to drain terminal D of the circuit of FIG. 1.

The source of an elementary cell corresponds to an N$^+$-type ring 25 formed in a P-type well 23. Well 23 generally comprises a heavily-doped P-type (P$^+$) central area 24. A source metallization 26 is in contact with the central portion of each well 23 and with ring 25.

The gate of an elementary cell is formed by a polysilicon layer 27, isolated from the wafer surface by a dielectric, which covers a channel area included between the external periphery of ring 25 and the external periphery of well 23. Gates 27 are interconnected to a gate node G.

FIG. 2 shows three elementary cells of power transistor T1. Metallizations 26 of these elementary cells are connected to a same source node S1. Similarly, two elementary cells of measurement transistor T2 have been shown, metallizations 26 of these cells being connected to the same source node S2.

FIG. 3 shows at a greater scale a portion of FIG. 2 on which parasitic elements existing between two adjacent elementary cells have been shown. Conventionally, gate 27 also covers the area of substrate 21 included between the two elementary cells. This metallization, isolated from substrate 21, corresponds to a gate of a parasitic transistor T3 of PMOS type formed of a P-type well 23 of a first elementary cell, of an N-type substrate portion 21, and of a second P-type well 33 of a second elementary cell.

On the other hand, the association of an N$^+$-type area 25, of a P-type well 23, and of lightly-doped N-type substrate 21, forms an NPN-type bipolar parasitic transistor, the emitter of which is area 25, the collector of which is area 21, and the base of which is well 23.

Consider an elementary cell T1$i$ of the power transistor adjacent to an elementary cell T2$j$ of the measurement transistor, the sources of which are respectively S1 and S2. An NPN-type bipolar transistor T4 is connected between source S1 and drain D of the cell of transistor T1. The base of transistor T4 is connected to the drain of a parasitic PMOS transistor T3. Similarly, an NPN-type bipolar transistor T5 is connected between source S2 and drain D of the cell of transistor T2, the base of transistor T5 is connected to the source of MOS transistor T3. MOS transistor T3 is controlled by gate G common to transistors T1 and T2.

As illustrated in FIG. 1, if load L of transistor T1 is an inductive load, the voltage across the load, that is, on source S1, will become negative when the power transistor will be off. Gate G, which corresponds to the gate of transistor T3 is then negative but at a voltage greater than source S1, and source S2 is at a potential close to the ground. If the voltage is very negative on source S1, MOS transistor T3 which is then on lets through a high current between terminals S2 and S1. When this current, which flows, in particular, under N$^+$ region 25, exceeds given threshold, bipolar transistor T4 turns on. This creates a short-circuit between source terminal 26 and drain terminal 22 of cell T2$i$. Terminal 26 being at a very negative potential and terminal 22 being at potential Vcc, a destructive breakdown of the structure may result therefrom. The current which flows through transistor T4 depends on the gain of this transistor. Now, in the framework of modem technologies, the size of wells 23 decreases and the doping level of areas 24 is reduced. As a result, the gain of parasitic bipolar transistors T4 increases and thus the destructive breakdown risk increases.

The present inventors have thus searched various ways for eliminating the destructive effects linked to the turning-on of parasitic bipolar transistors by the above-mentioned parasitic MOS transistors.

FIG. 4 very schematically shows a top view of a device such as shown in FIG. 1. Block T1 represents the surface occupied by the elementary cells of power transistor T1 and block T2 represents the surface occupied by the elementary cells of measurement transistor T2. T3 symbolizes the parasitic MOS transistors existing between the adjacent cells of the power transistor and of the measurement transistor.

FIG. 5 shows a vertical cross-sectional view of a first solution to avoid the above-mentioned destructive breakdowns. The structure is very close to the structure shown in FIG. 2, and the same reference characters designate the same elements. Between two adjacent elementary cells T1$i$ and T2$j$, respectively belonging to the power transistor and to the measurement transistor, is interposed a buffer cell B. Such a buffer cell may be implemented by eliminating the N$^+$ implantation of the sources in an elementary cell of T1. There no longer exist parasitic bipolar transistors.

FIG. 6 very schematically shows a top view of a device such as that in FIG. 5. Block T1 shows the surface occupied by the elementary cells of power transistor T1, block T2 represents the surface occupied by the elementary cells of measurement transistor T2, and block B represents the surface occupied by the buffer cells placed between the power transistor and the measurement transistor. Transistor T3 represents the parasitic MOS transistors existing between the elementary cells of measurement transistor T2 and the adjacent buffer cells B.

In FIG. 5, the currents flowing in normal operation from the source of elementary cells of the power and measurement transistors have been represented by arrows. The elementary cells adjacent to buffer cells B receive, in normal operation, a greater current density than the other elementary cells. The ratio between the currents flowing through transistors T1 and T2 varies with the value of the currents. This imbalance of the currents no longer enables simply determining the current in power transistor T1 based on the current flowing through measurement transistor T2.

SUMMARY OF THE INVENTION

An object of the present invention is to implement the protection of a device such as that shown in FIG. 1.

An object of the present invention is to implement a device including a power transistor and a measurement transistor in which there is, in normal operation, a constant ratio between the current flowing through the measurement transistor and the current flowing through the power transistor.

Another object of the present invention includes providing a low cost and easy to implement solution to the problems encountered in prior art.

These objects, as well as others, are achieved by a device that protects a monolithic component, comprising a MOS-type vertical diffused power transistor formed of a great number of identical cells, and a measurement transistor formed of a smaller number of cells identical to those of the power transistor, the drains and the gates of all cells being common, an inductive load being connected to the source of the power transistor, and comprising:

a short-circuiting means connected between the source of the power transistor and the source of the measurement transistor, and a control means that turns on the short-circuiting means when the power transistor turns off.

According to an embodiment of the present invention, the short-circuiting means is a MOS transistor.

According to an embodiment of the present invention, the control means is a dividing bridge connected across the inductive load.

According to an embodiment of the present invention, the control means includes a diode, the anode of which is connected to the gate of the short-circuiting transistor and the cathode of which is connected to the cathode of an avalanche diode, the anode of which is connected to the source of the power transistor, and a resistor connected between the gate of the short-circuiting transistor and a reference voltage which may be, in one embodiment, ground.

According to an embodiment of the present invention, the substrate and the source of the short-circuiting transistor are interconnected.

According to an embodiment of the present invention, the short-circuiting means is a lateral transistor implemented in the same monolithic component as the vertical power and measurement transistors.

The foregoing objects, features and advantages of the present invention will be discussed in detail in the following non-limiting description of specific embodiments in connection with the accompanying drawings.

DETAILED DESCRIPTION

Figure 1:
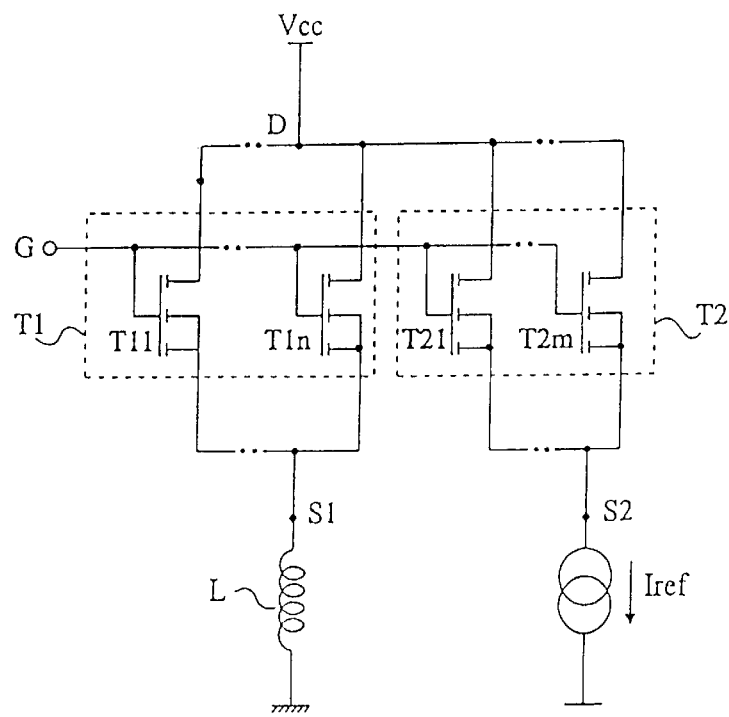
FIG. 1 shows a device according to prior art.

In the various drawings, the same reference characters designate the same elements. Further, as is conventional in the field of the representation of semiconductor components, the various cross-sectional and top views are not drawn to scale.

Figure 7:
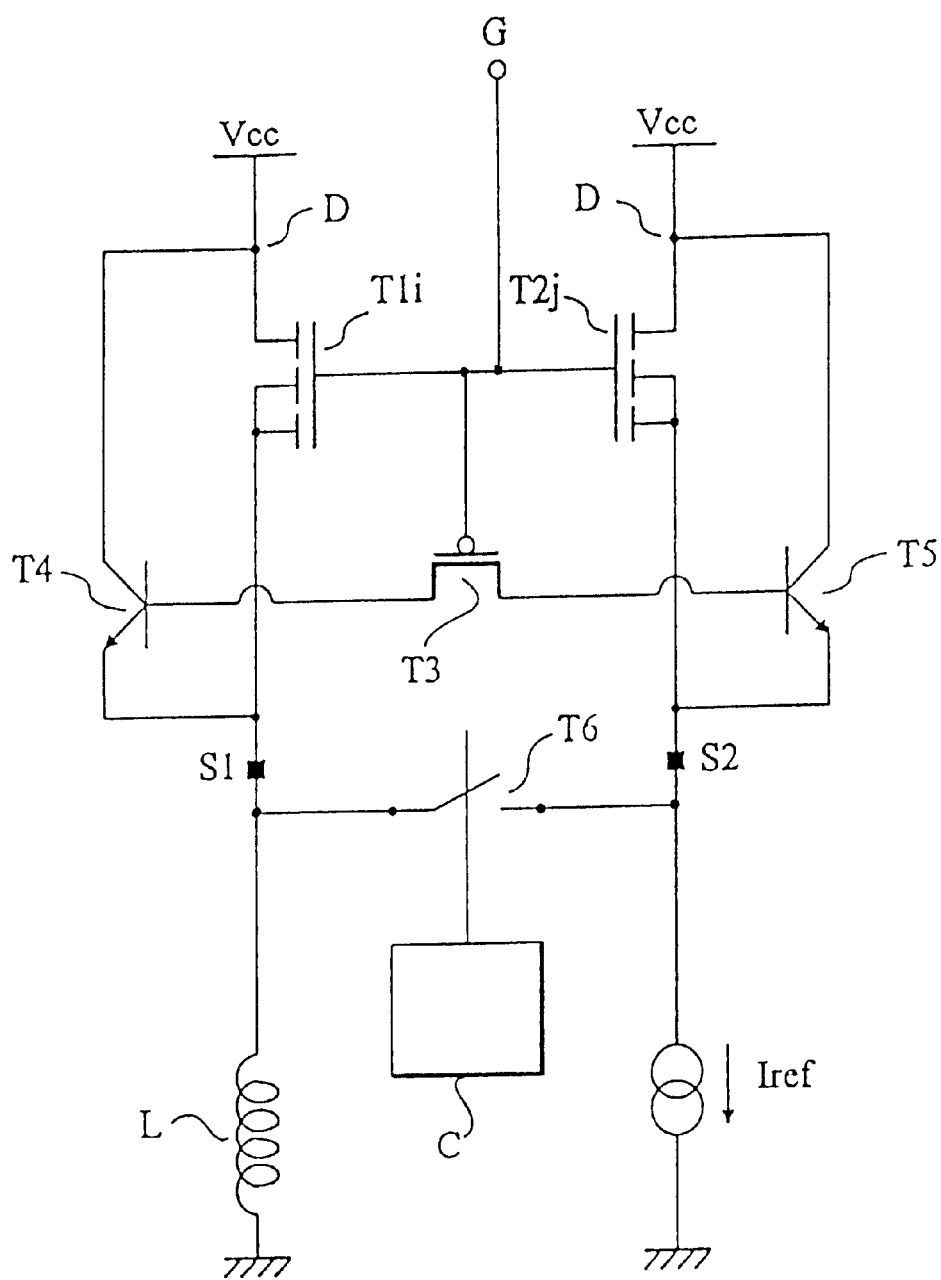
FIG. 7 shows a diagram in the form of blocks according to the present invention.

FIG. 7 shows a simplified diagram of a circuit according to the present invention. A cell T1$i$ among the n elementary cells T1$1$ to T1$n$ of a power transistor T1, and an elementary cell T2$j$ among the m elementary cells T2$l$ to T2$m$ of a measurement transistor, cell T1$i$ being adjacent to cell T2$j$. The drains of elementary cells T1$i$ and T2$j$ are connected to a drain D common to all cells, themselves connected to a high supply potential Vcc. The gates G of cells T1$i$ and T2$j$ are connected together to a control terminal G common to all cells. The source of cell T1$i$ is connected to a terminal S1 connected to all cells of power transistor T1, itself connected to the ground by an inductive load L. The source of cell T2$j$ is connected to a terminal S2 common to all cells of measurement transistor T2, itself connected to a current source $I_{ref}$. As in prior art, the voltage difference between terminals S1 and S2 gives an indication of the fact that the current in the power transistor is greater or smaller than a threshold equal to (n/m)$I_{ref}$. It should be noted that FIG. 7 is very simplified, and that a resistor is conventionally connected in series with current source $I_{ref}$, for example, to limit the current in T3 when on, and to have the voltage on S2 drop when S1 becomes negative. This limits voltage $V_{GS2}$ of T2 when S1 and G become negative and thus to avoids a breakdown of the gate oxide of T2.

Figure 3:
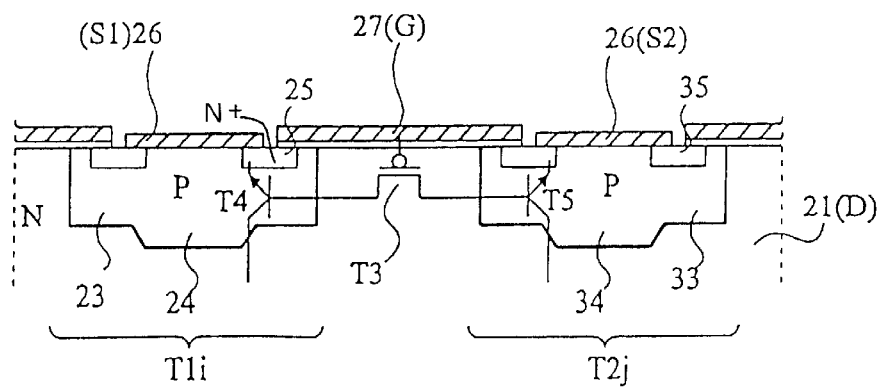
FIG. 3 shows parasitic components in a detail of FIG. 2.
Figure 4:
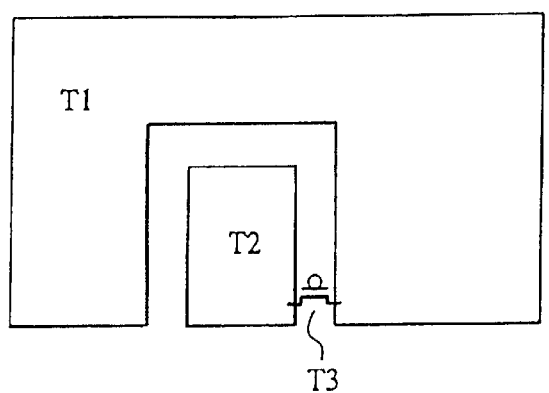
FIG. 4 very schematically shows a top view of the embodiment shown in FIG. 1.
Figure 5:
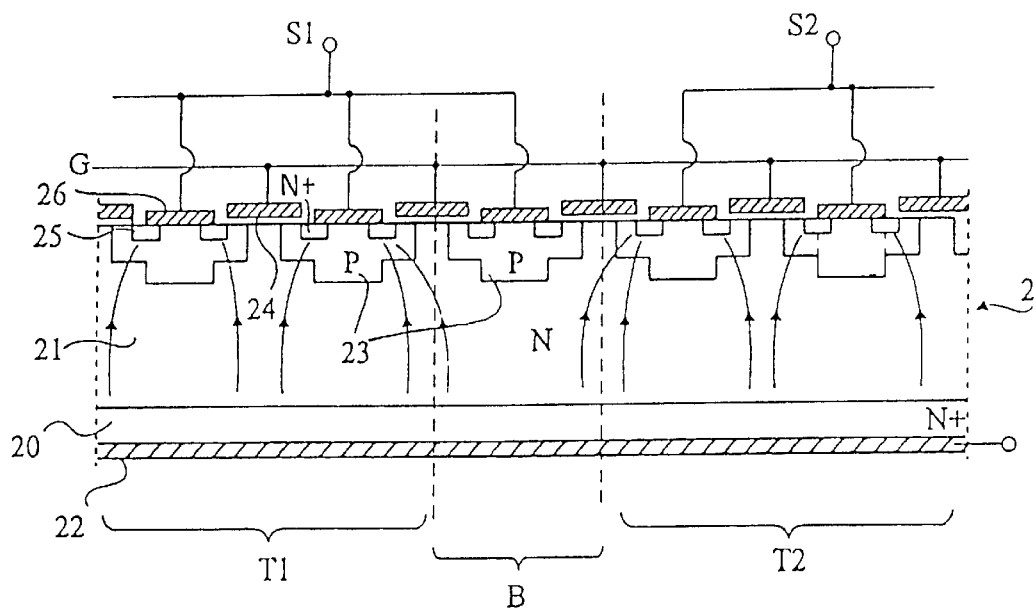
FIG. 5 shows the cross-sectional view of another embodiment according to prior art.
Figure 6:
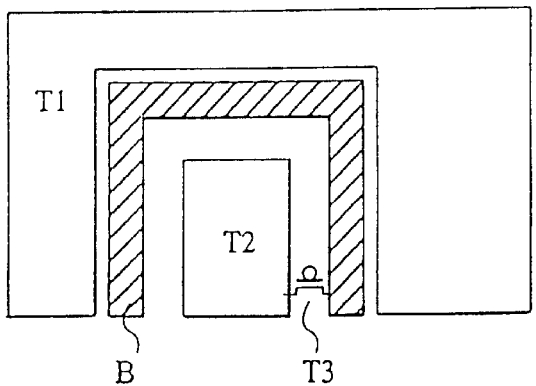
FIG. 6 very schematically shows a top view of the embodiment shown in FIG. 5.

FIG. 7 also shows parasitic transistors which are associated with cells T1$i$ and T2$j$. A bipolar parasitic transistor T4 is connected in parallel on cell T1$i$. A bipolar parasitic transistor T5 is connected in parallel on cell T2$j$. The bases of transistors T4 and T5 are respectively connected to the drain and the source of a parasitic MOS transistor T3. The gate of parasitic MOS transistor T3 is connected to gate G of the circuit. These parasitic elements are such as described in relation with FIG. 3.

According to the present invention, a short-circuiting means T6 is connected between common source terminals S1 and S2. Short-circuiting means T6 is controlled by a control means C which is turns on means T6 upon the turning-off of power transistor T1.

Figure 8:
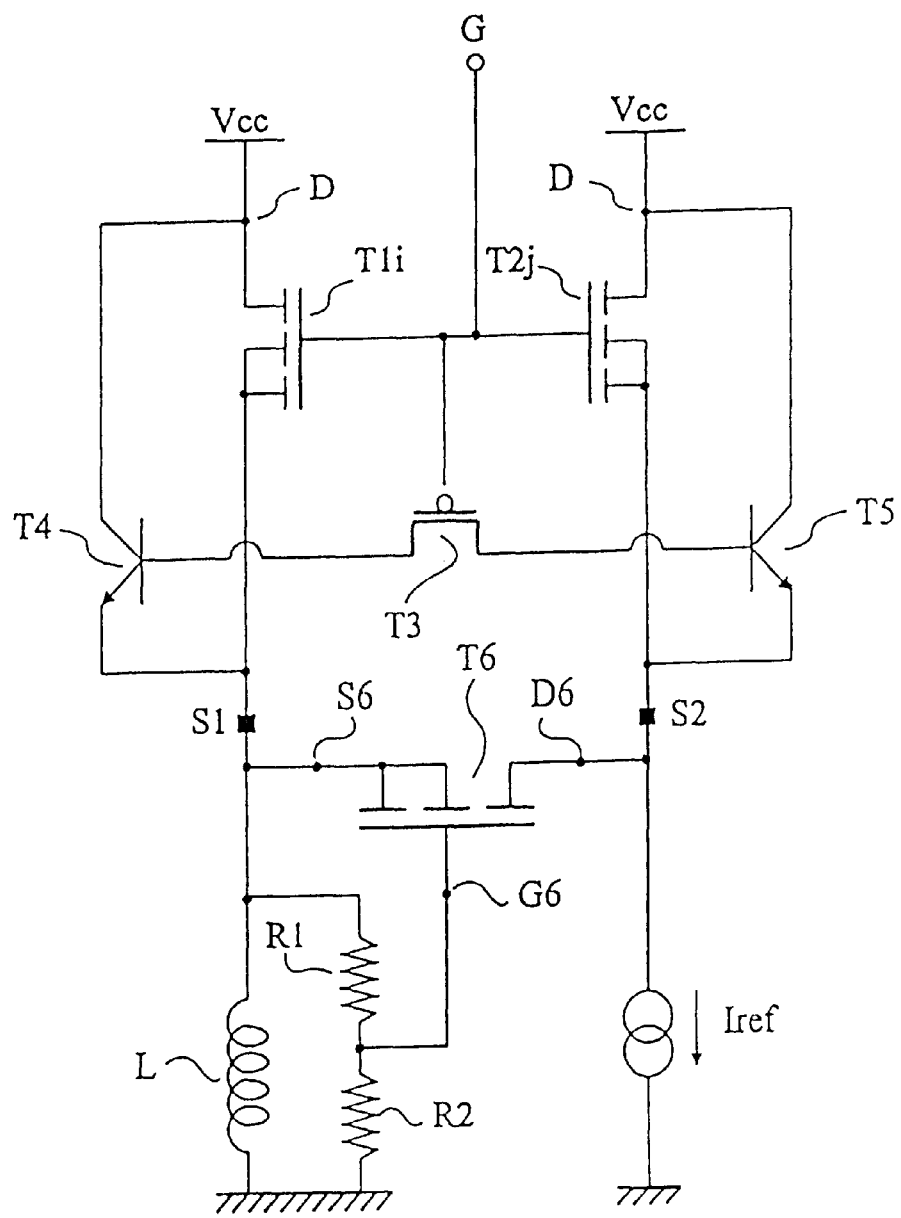
FIG. 8 very schematically shows an embodiment according to the present invention.

FIG. 8 shows an embodiment of short-circuiting means T6 and of control means C. The short-circuiting means is a MOS transistor T6, the source S6 of which is connected to source terminal S1 and the drain D6 of which is connected to source terminal S2. Two resistors R1 and R2 are connected in series across load L, the connection node of the two resistors is connected to gate G6 of transistor T6.

Resistors R1 and R2 form a dividing bridge connected across load L. Resistors R1 and R2 are chosen to turn on transistor T6 when power transistor T1 is off, and the voltage across load L exceeds a predetermined negative threshold. This predetermined negative threshold can, for example, be chosen to be greater than the negative threshold for which the current flowing through the above-mentioned parasitic elements will turn on parasitic transistor T4.

When turned on, transistor T6 short-circuits source terminals S1 and S2 of the circuit and eliminates any risk of crossing of parasitic MOS transistor T3 and thus of turning-on of parasitic bipolar transistor T4. Any risk of breakdown of the structure is thus avoided.

In normal operating mode, the voltage across load L is such that transistor T6 remains off, and the present invention thus does not affect the normal operating mode.

Figure 2:
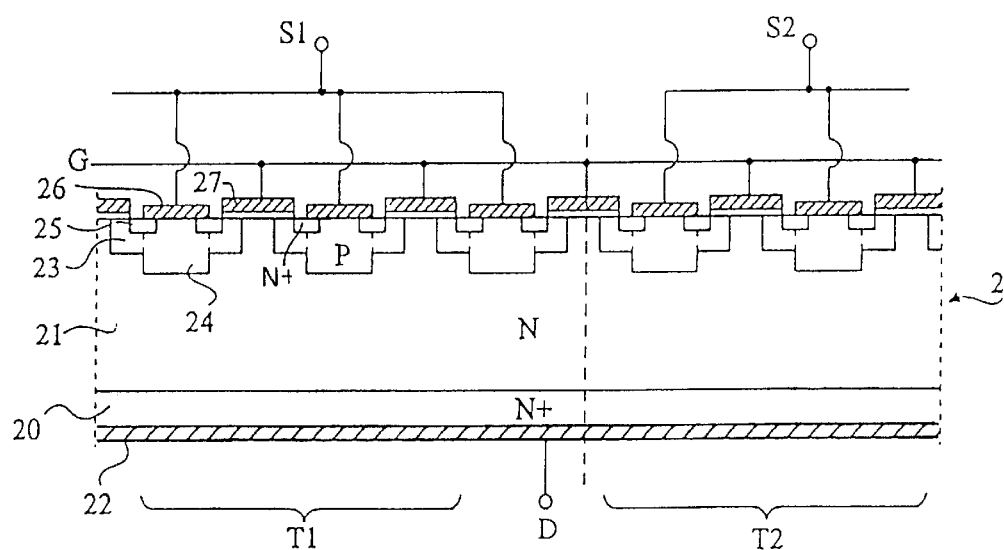
FIG. 2 shows a partial cross-sectional view of the device shown in FIG. 1.
Figure 9:
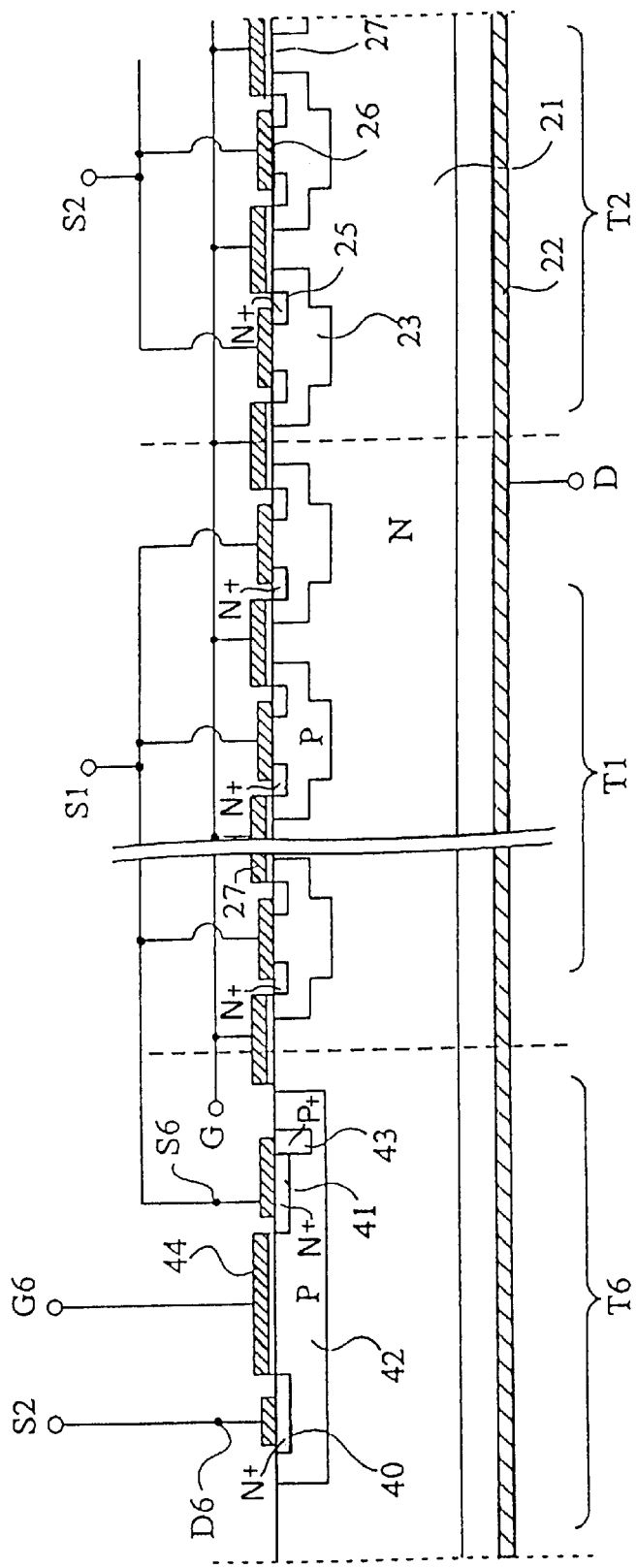
FIG. 9 very schematically shows a cross-sectional view of the embodiment shown in FIG. 8.

FIG. 9 shows a simplified cross-sectional view of a portion of the circuit according to the present invention. The right-hand portion of the circuit illustrates cells of vertical MOS transistors T1 and T2 described in relation with FIG. 2. Further, in the left-hand portion of FIG. 9, an implementation of a short-circuiting transistor T6 has been shown in the form of a lateral-type MOS transistor. The drain of transistor T6 is formed of a heavily-doped $N^+$-type area 40 formed in a P-type well 42. Drain D6 of transistor T6 is connected to source terminal S2 of the measurement transistor. The source of transistor T6 is formed of a heavily-doped $N^+$-type region 41 formed in well 42. Source S6 of transistor T6 is connected to source terminal S1 of the power transistor. Well 42 is biased by a heavily-doped $P^+$-type area 43, also formed in well 42, and connected to terminal S1. Gate G6 of transistor T6 is formed by a polysilicon layer 44 located above the section of well 42 comprised between areas 40 and 41, isolated from the surface of well 42 by a dielectric.

Figure 10:
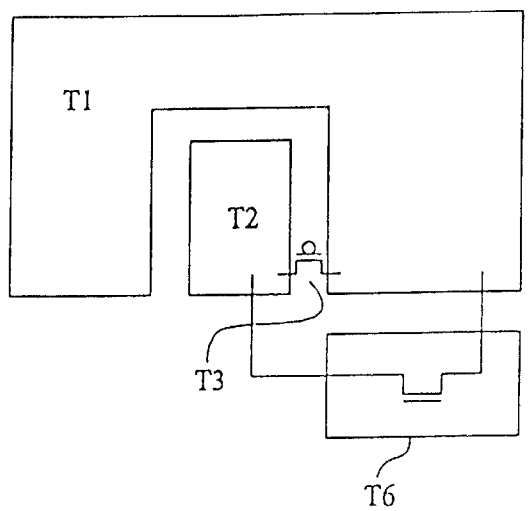
FIG. 10 very schematically shows a top view of the embodiment shown in FIG. 8.

FIG. 10 shows a simplified top view of a circuit according to the present invention. Transistor T6 has been implanted in the vicinity of transistors T1 and T2. The respective sizes of transistors T1, T2, T6 are determined according to the maximum currents meant to flow therethrough.

Short-circuiting transistor T6 is, as has been seen previously, off in normal operating mode. The ratio between the currents flowing through power transistor T1 and measurement transistor T2 remains constant and determined (equal to n/m as described in relation with FIG. 1). The present invention thus protects the device described in prior art while keeping the same ratio between the measurement current and the current in a power transistor. The addition of transistor T6 further is of low cost and easy to implement.

Of course, the present invention is likely to have various alterations, modifications, and improvements which will readily occur to those skilled in the art. Thus, short-circuiting means T6 can be implemented by other structures than a MOS transistor, for example, a bipolar transistor or a thyristor. Similarly, control means C can be a dividing bridge, but other control means performing the same function may also be used.

Figure 11:
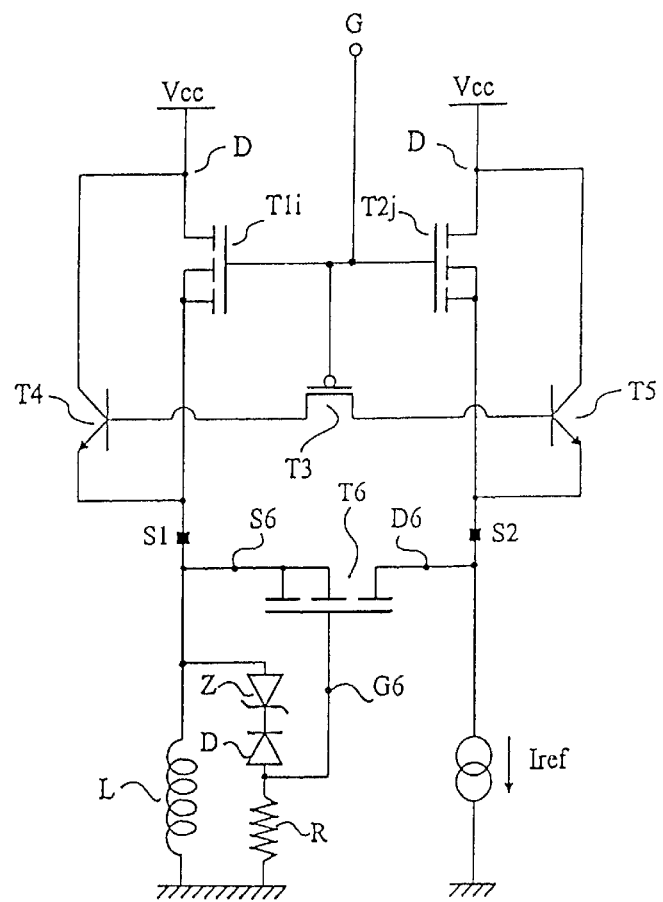
FIG. 11 very schematically shows another embodiment according to the present invention.

FIG. 11 shows as an example an alternative of the control means of transistor T6. Instead of a resistive dividing bridge, a circuit including a diode D, an avalanche diode Z, and a resistor R is here used. The anode of diode D is connected to gate G6 of transistor T6, its cathode being connected to the cathode of avalanche diode Z. The anode of avalanche diode Z is connected to source terminal S1. The second terminal of resistor R is connected to the ground. The reverse conduction voltage of avalanche diode Z is chosen so that transistor T6 is turned on when the voltage at S1 becomes more negative than a predetermined threshold. The control means formed by avalanche diode Z, diode D, and resistor R will consume less in normal operation mode than the dividing bridge formed of resistor R1 and of resistor R2 shown in FIG. 8.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device that protects a monolithic component comprising a MOS-type vertical diffused power transistor formed of a number of identical cells, and a measurement transistor formed of a number of cells identical to those of the power transistor, the number of power transistor cells being greater than the number of measurement transistor cells the drains of all cells being coupled in common, the gates of all cells being coupled in common, an inductive load being connected to a source of the power transistor, comprising:

a short-circuiting means, connected between the source of the power transistor and the source of the measurement transistor, and a control means that turns on the short-circuiting means when the power transistor turns off.

2. The protection device of claim 1, wherein the short-circuiting means is a MOS transistor.

3. The protection device of claim 1, wherein the control means is a dividing bridge connected across the inductive load.

4. The protection device of claim 1, wherein the short-circuiting means comprises a short-circuiting transistor, the control means comprises a diode, an anode of which is connected to a gate of the short-circuiting transistor and a cathode of which is connected to a cathode of an avalanche diode, an anode of which is connected to a source of the power transistor, and a resistor connected between the gate of the short-circuiting transistor and ground.

5. The protection device of claim 2, wherein a substrate and the source of the short-circuiting transistor are interconnected.

6. The protection device of claim 2, wherein the short-circuiting means is a lateral transistor implemented in the same monolithic component as the vertical power and measurement transistors.

7. The protection device of claim 1, wherein said short-circuiting means comprises a MOS transistor having main terminals connected between the source of the power transistor and the source of the measurement transistor, and a control terminal controlled by said control means.

8. The protection device of claim 7, wherein said control means comprises resistive means.

9. The protection device of claim 7, wherein said control means comprises a circuit coupled across said load.

10. The protection device of claim 7, wherein the drain of the short-circuiting transistor is formed of a heavily-doped N-type area formed in a P-type well.

11. The protection device of claim 10, wherein the drain of the short-circuiting transistor is connected to the source terminal of the measurement transistor.

12. The protection device of claim 11, wherein the source of the short-circuiting transistor is formed of a heavily doped N-type region formed in said well.

13. The protection device of claim 12, wherein the source of the short-circuiting transistor is connected to the source terminal of the power transistor.

14. The protection device of claim 13, wherein said well is biased by a heavily doped P-type area formed in said well and connected to the source terminal of the power transistor.

15. The protection device of claim 14, wherein the gate of the short-circuiting transistor is formed by a polysilicon layer located above a section of the well between said heavily doped N-type area and said heavily doped N-type region and isolated from the surface of the well by a dielectric.

16. In a monolithic component that is comprised of a MOS-type vertical power transistor formed of a plurality of like cells, a measurement transistor also formed of a plurality of like cells, the drains of all cells of both transistors coupled in common, the gates of all cells of both transistors coupled in common, and an inductive load connected to a source of the power transistor, the improvement comprising, a protection device including;

a semiconductor control device having main terminals connected between the source of the power transistor and the source of the measurement transistor;

said semiconductor control device also having a control terminal for controlling the state thereof between open and short-circuit states; and a control circuit coupled to the control terminal of said semiconductor control device responsive to said power transistor turning off to switch said semiconductor control device to said short-circuit state.

17. The device of claim 16, wherein the semiconductor control device is a MOS transistor.

18. The device of claim 17, wherein said control circuit comprises a resistive circuit.

19. The device of claim 16, wherein the semiconductor control device comprises a short-circuiting transistor, the control circuit comprises a diode, an anode of which is connected to a gate of the short-circuiting transistor and a cathode of which is connected to a cathode of an avalanche diode, an anode of which is connected to a source of the power transistor, and a resistor connected between the gate of the short-circuiting transistor and ground.

20. The device of claim 19, wherein a substrate and a source of the short-circuiting transistor are interconnected.

21. The protection device of claim 19, wherein the short-circuiting transistor is a lateral transistor implemented in the same monolithic component as the vertical power and measurement transistors.

22. The protection device of claim 21, wherein the drain of the short-circuiting transistor is formed of a heavily-doped N-type area formed in a P-type well.

23. The protection device of claim 22, wherein the drain of the short-circuiting transistor is connected to the source terminal of the measurement transistor.

24. The protection device of claim 23, wherein the source of the short-circuiting transistor is formed of a heavily doped N-type region formed in said well.

25. The protection device of claim 24, wherein the source of the short-circuiting transistor is connected to the source terminal of the power transistor.

26. The protection device of claim 25, wherein said well is biased by a heavily doped P-type area formed in said well and connected to the source terminal of the power transistor.

27. The protection device of claim 26, wherein the gate of the short-circuiting transistor is formed by a polysilicon layer located above a section of the well between said heavily doped N-type area and said heavily doped N-type region and isolated from the surface of the well by a dielectric.

28. A method of protecting a monolithic component that is comprised of a MOS-type power transistor formed of a plurality of like cells, a measurement transistor also formed of a plurality of like cells, the drains of all cells of both transistors coupled in common, the gates of all cells of both transistors coupled in common, and an inductive load connected to a source of the power transistor, said method comprising the steps of:

connecting the main terminals of a semiconductor control device between the source of the power transistor and the source of the measurement transistor;

said semiconductor control device also having a control terminal for controlling the state thereof between open and short-circuit states; and sensing the state of said power transistor as to its on or off state; and responsive to said power transistor turning off, switching said semiconductor control device to said short-circuit state.

29. The method of claim 28, wherein the step of sensing the state of the power transistor includes sending the state by providing a control means coupled to the control terminal of the semiconductor control device.

30. The method of claim 29 including providing the control means disposed across said load.

* * * * *